US011443826B2

(12) United States Patent
Danjean et al.

(10) Patent No.: US 11,443,826 B2
(45) Date of Patent: Sep. 13, 2022

(54) STORAGE AREA RETIREMENT IN A STORAGE DEVICE (71) Applicant: SEAGATE TECHNOLOGY LLC, Cupertino, CA (US)

(72) Inventors: Ludovic Danjean, San Jose, CA (US); Abdelhakim Alhussien, San Jose, CA (US); Erich Franz Haratsch, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 283 days.

(21) Appl. No.: 16/883,081

(22) Filed: May 26, 2020

(65) Prior Publication Data
US 2020/0286577 A1    Sep. 10, 2020

Related U.S. Application Data (63) Continuation of application No. 15/964,691, filed on Apr. 27, 2018, now Pat. No. 10,699,797.

(51) Int. Cl.
*G11C 29/14* (2006.01)
*G11C 29/42* (2006.01)
*G11C 29/52* (2006.01)
*G06F 11/10* (2006.01)

(52) U.S. Cl.
CPC .......... *G11C 29/42* (2013.01); *G06F 11/1068* (2013.01); *G11C 29/52* (2013.01)

(58) Field of Classification Search
CPC ...... G11C 29/42; G11C 29/52; G06F 11/1068
See application file for complete search history.

(56) References Cited

U.S. PATENT DOCUMENTS

| 8,516,343 | B2* | 8/2013 | Flynn | G11C 29/88 714/773 |
| 8,996,961 | B2* | 3/2015 | Chen | G06F 11/1012 714/773 |
| 2015/0154061 | A1* | 6/2015 | Camp | G06F 11/1012 714/6.13 |
| 2015/0262712 | A1* | 9/2015 | Chen | G11C 29/44 714/723 |

* cited by examiner

*Primary Examiner* — Cynthia Britt
*Assistant Examiner* — Rong Tang
(74) *Attorney, Agent, or Firm* — Taylor English Duma LLP (57) ABSTRACT Systems and methods presented herein provide for testing degradation in a storage device. In one embodiment, a storage controller is operable to test individual portions of a first of the plurality of storage areas of the storage device by: analyzing individual portions of the first storage area; determining that one or more of the individual portions of the first storage area have failed; and retire the failed one or more portions of the first storage area. The storage controller is further operable to write to the first storage area using an error correction code (ECC), and to test the remaining portions of the first storage area to determine whether the first storage area should be retired in response to writing to the first storage area.

20 Claims, 6 Drawing Sheets

STORAGE AREA RETIREMENT IN A STORAGE DEVICE

CROSS-REFERENCE

This application is a continuation of U.S. application Ser. No. 15/964,691, filed Apr. 27, 2018, which is hereby incorporated by reference herein in its entirety.

SUMMARY

Systems and methods presented herein provide for testing portions of a storage device for degradation. In one embodiment, a storage system includes a storage device comprising a plurality of storage areas that are operable to store data. The storage system also includes a controller operable to test individual portions of a first of the plurality of storage areas of the storage device by: analyzing individual portions of the first storage area; determining that one or more of the individual portions of the first storage area have failed; and retiring the failed one or more portions of the first storage area. The storage controller is further operable to write to the first storage area using an error correction code (ECC), and to test the remaining portions of the first storage area to determine whether the first storage area should be retired in response to writing to the first storage area.

The various embodiments disclosed herein may be implemented in a variety of ways as a matter of design choice. For example, the system and method embodiments hereof may take the form of computer hardware, software, firmware, or combinations thereof. Other exemplary embodiments are described below.

BRIEF DESCRIPTION OF THE FIGURES

Some embodiments are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody certain principles that are included within the scope of the embodiments. Furthermore, any examples described herein are intended to aid in understanding the principles of the embodiments and are to be construed as being without limitation to such specifically recited examples and conditions. As a result, the embodiments are not limited to any specific examples described below.

Figure 1:
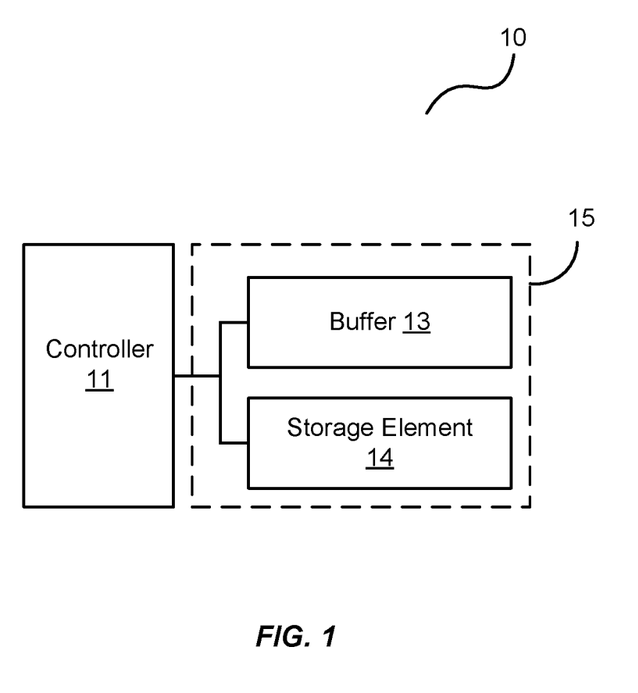
FIG. 1 is a block diagram of an exemplary storage device.

FIG. 1 is a block diagram of an exemplary storage system 10 that is operable to store data resulting from Input/Output (110) requests from a host system (exemplarily shown below). The storage system 10 comprises a storage device 15, which further comprises a storage element 14 (e.g., a non-volatile NAND flash device or other persistent storage device) for persistently storing data. The storage element comprises a plurality of storage areas for storing the data. The storage device may also include an optional buffer 13 (e.g., Dynamic Random Access Memory, or "DRAM", for caching, staging, etc.).

The storage system 10 also includes a controller 11 operable to process the I/O requests to write data to and to read data from the storage device 15. The controller 11 is also operable to maintain the integrity of the data stored with the storage device 15. For example, the controller 15 may remove data redundancies through a process called data deduplication, perform "garbage collection", and test degradation of the storage device 15, etc. In one embodiment, the controller 11 is operable to test individual portions of storage areas in the storage device 15 for degradation and to retire failing portions of the storage device 15 such that I/O operations to those portions are terminated. Then, the controller 11 writes to the storage areas using ECC and tests the storage areas to determine whether they should be retired as well.

Some data storage devices, such as Solid State Drives (SSDs), do not employ moving mechanical components like a Hard Disk Drive (HDD) does. For example, some storage devices use integrated circuitry as memory cells to persistently store data. The memory cells are arranged in "pages", which are arranged in "blocks". And, the blocks are arranged on a "plane" of a die. When data is to be written to storage device 15, the controller 11 programs the device 15 on a page-by-page basis until a block is full. Once the block of the storage device 15 is full, the block is closed until the controller 11 performs an erasure process on the block.

Memory cells are prone to failures the more they are used. Generally, the memory cells are designed to handle many thousands of erases, reads and writes before a failure occurs. For example, in some NAND flash devices, the erases and writes to the memory cells wear out the oxide layer of the floating gates of the cells, destroying their ability to store data. Once the memory cells of a block fail, then the block containing those cells is often removed from the available memory pool of the storage device even though portions (e.g., pages) of the block are still usable.

Although discussed with respect to SSDs, it should be noted that the embodiments herein are not intended to be limited to such devices. Rather, the embodiments herein may be used in any persistent storage device where portions of the storage device may degrade over time, including HDDs, shingled magnetic recording mediums, magnetoresistive storage devices, etc.

Based on the foregoing, the storage device 15 is any device operable to persistently store one or more bits of data. And, the controller 11 is any device, system, software, firmware, or combination thereof operable to service I/O requests to the storage device 15 and maintain the data thereof by testing portions of the storage element 14 for degradation and potential retirement.

Figure 2:
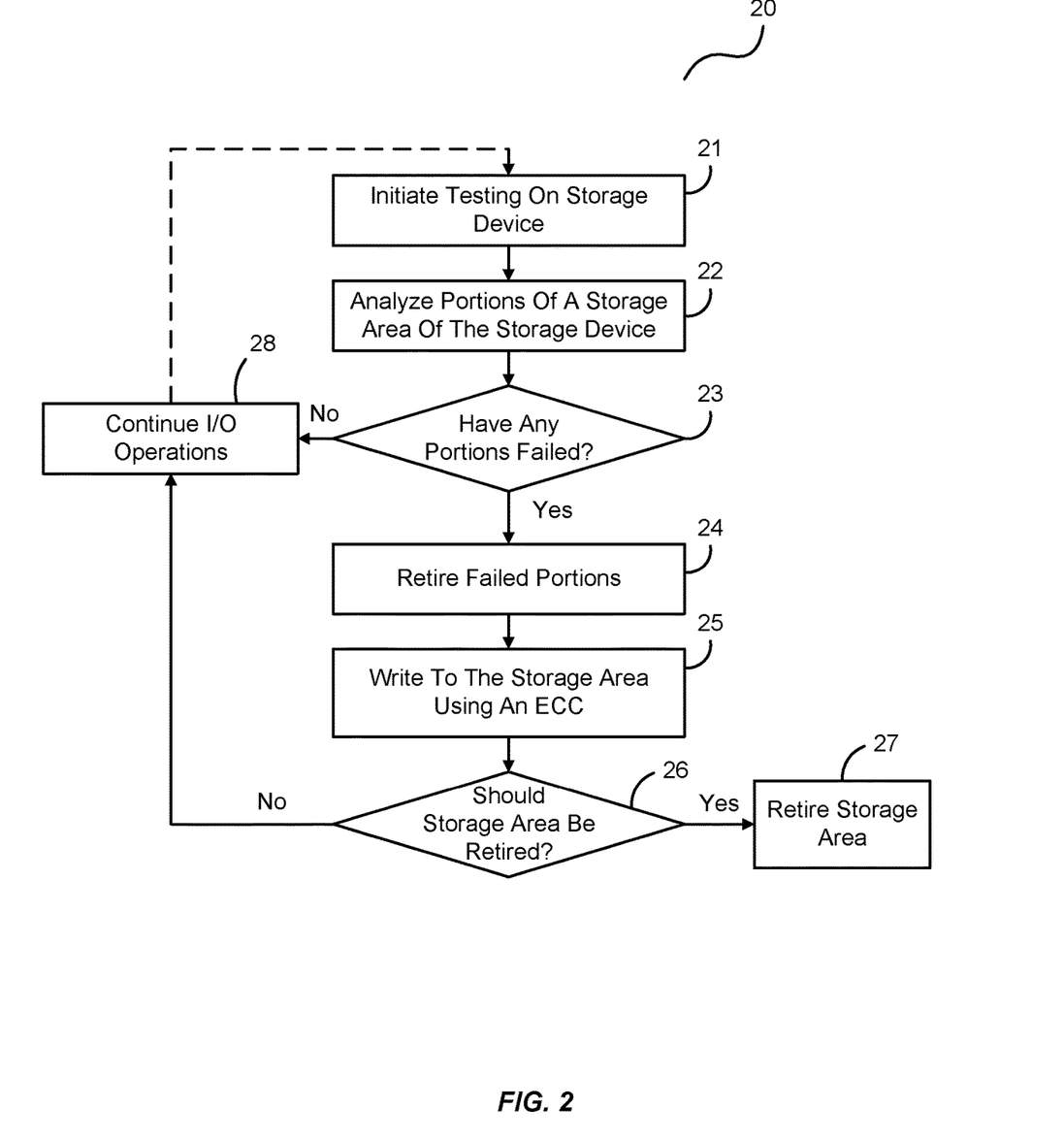
FIGS. 2-4 are flowchart of exemplary processes of the storage system of FIG. 1.

FIG. 2 is a flowchart of an exemplary process 20 of the storage system 10 of FIG. 1. In this embodiment, the controller 11 initiates testing on the storage device 15, in the process element 21. At this time, I/O operations to a storage area of the storage element 14 under test are suspended. In testing the storage area, the controller 11 analyzes portions (e.g., pages) of the storage area (e.g., a block of an SSD), in the process element 22, to determine whether any of those portions have failed, in the process element 23. If the tested portions have not failed, the controller 11 continues I/O operations thereto, in the process element 28. As indicated by the dotted line from the process element 28 to the process element 21, the controller 11 may periodically test the portions as part of a background operation to ensure that they are still capable of storing data.

If, however, a tested portion of the storage area has failed, in the process element 23, then the controller 11 retires the failed portion of the storage area, in the process element 24. At this point, the failed portion of the storage area is flagged as retired and I/O operations to the failed portion of the storage area are terminated. After retirement, the controller 11 writes data (e.g., test data, random data, etc.) using ECC to the remaining portions of the storage area, in the process element 25.

The controller 11 may also write data (e.g., test data, random data, etc.) to the failed portion of the storage area to alleviate stress on the remaining storage areas. For example, continually writing "around" a failed page may affect other portions of the storage device 15. So, the storage controller 11 may write random data as though it were any operational portion of the storage device. The flagging of the failed portion, however, may keep I/O operations from accessing that portion and/or keep the failed portion from being tested again.

Afterwards, the controller 11 tests the storage area to determine whether the storage area as well should be retired, in the process element 26. For example, if some number of portions within the storage area greater than a threshold number, the controller 11 will retire the storage area and remove it from the storage pool that is the storage element 14, thereby terminating I/O operations to the storage area, in the process element 27. Otherwise, the controller 11 removes the storage area from suspension and returns it to the storage pool for regular I/O operations.

It should also be noted that the I/O requests can and often do come directly from a host system. However, I/O requests may be cached in another device before arriving at the storage system 10. For example, the I/O requests may be cached within the buffer 13 before being executed, or may even be issued by other storage devices themselves. Accordingly, the embodiment is not intended to be limited to any particular type of I/O request.

Figure 3:
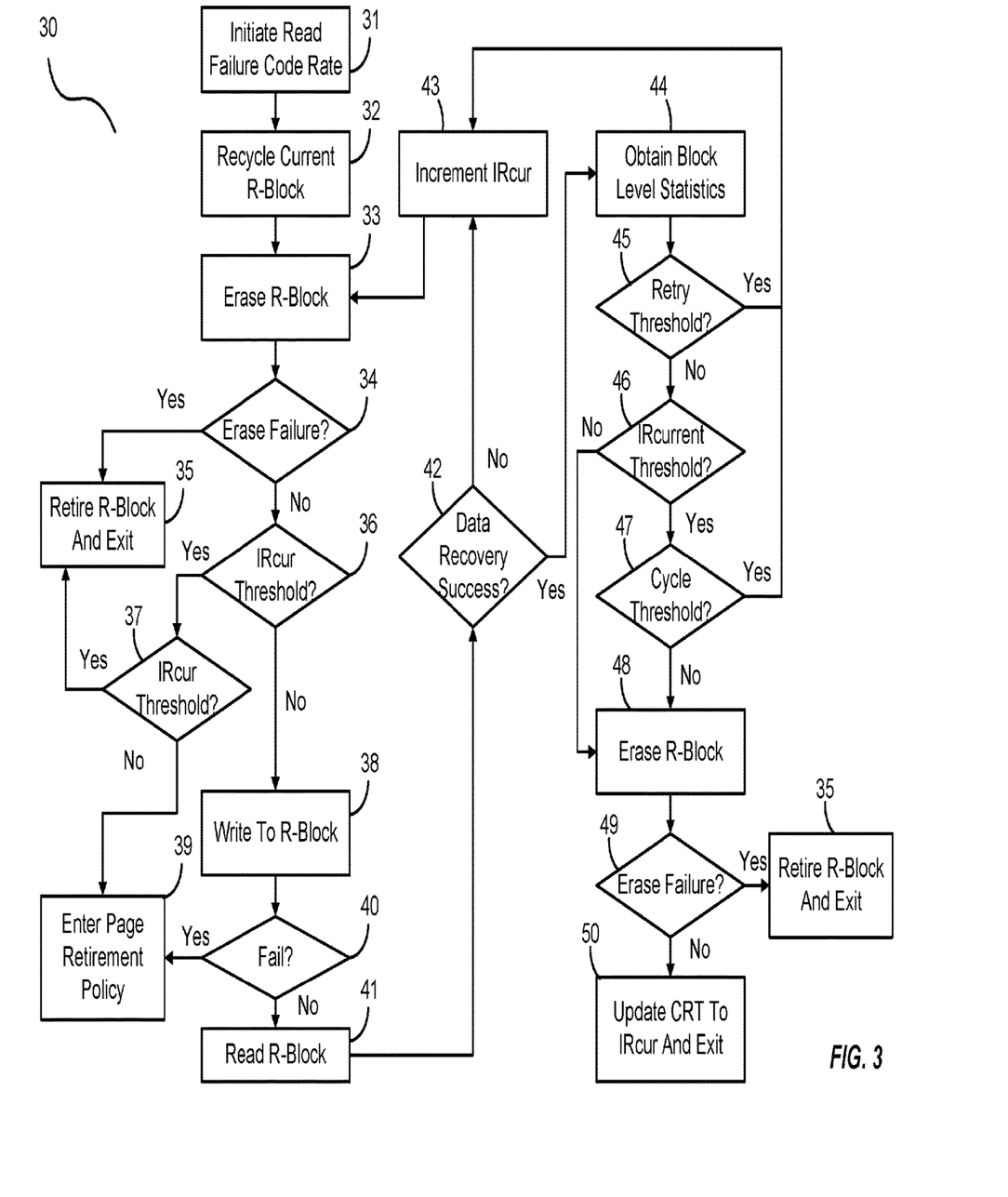

FIG. 3 is flowchart of another exemplary process 30 of the storage system 10 of FIG. 1. In this embodiment, the controller 11 initiates a read failure code rate (RFCR) test to determine whether a block of the storage element 14 can still be used in the event that certain pages of the block are no longer operable and thus retired, in the process element 31. In this regard, the controller 11 also uses the RFCR test to determine whether certain pages within the block should be retired.

For example, word lines are connected to gates of memory cells in a row of a page and are used to activate the entire row for reading, writing, and erasing. The controller 11 identifies which pages and word lines of the storage element 14 are responsible for causing hard decision low density parity check (HLDPC) failures, erase failures, and/or program failures (e.g., write failures). The controller 11 may then retire those pages and restart the RFCR test on an "R-block" to determine whether the R-block itself should be retired. An R-block is a collection of nonvolatile memory blocks of the storage element 14 (e.g., a block from each nonvolatile memory die in the storage element 14 with the nonvolatile memory locations within the blocks being written in a striped fashion).

Once the RFCR test is initiated, the controller 11 recycles a current R-block of the storage element 14, in the process element 32. In doing so, the controller 11 moves the data of the current R-block to another location in the storage element 14 and erases the current R-block, in the process element 33. The controller 11 also retrieves the current code rate (IRcur) of the R-block that was employed when entering the RFCR test. The controller 11 then sets the IRcur as the original code rate IRorg.

Then, the controller 11 determines whether there was an erase failure to the current R-block, in the process element 34. If there was an erase failure to the current R-block being tested, then the controller 11 retires the R-block and exits the RFCR test, in the process element 35. In another embodiment, the controller 11 may retire only the block on which the erase failure occurred.

If there was no erase failure, in the process element 34, then the controller 11 determines if the current code rate (IRcur) of the ECC has breached a threshold, in the process element 36. For example, as illustrated in the exemplary table below, the controller 11 may use two tiers of code rates (Tier 1 and Tier 2). Tier-1 code rates have a pre-computed target average number of iterations (e.g., TANI) to ensure that the decoding throughput target is met at the target average. For an iterative decoder, the throughput is inversely proportionally to the actual average number of decoding iterations.

| Tier | Code Rate | Code Rate Index | Target Average Number of Iterations |
|---|---|---|---|
| 1 | 0.949 | 0 | 3.7 |
| 1 | 0.927 | 1 | 3.4 |
| 1 | 0.905 | 2 = IRMax1 | 3.2 |
| 2 | 0.877 | 3 | N/A |
| 2 | 0.851 | 4 = IRMax2 | N/A |
| Bad Blocks | 0.0 | 5 | N/A |

The code rate adjustment criterion is different in each tier. IRMax1 is the index of the lowest code rate in tier-1, and IRMax2 is the index of the lowest code rate in Tier 2. IRMax2 is generally the lowest code rate that can be supported in the life of a storage device. In other embodiments, however, a single tier may be defined for the code rates. For example, the controller may set IRMax1 to a maximum allowable value and use the same code rate adjustment criteria for all code rates, rather than having two separate tiers with different criteria. Generally, the table does not specify the target average number of iterations for the Tier 2 code rates so as to simplify the policy.

With this in mind, the controller 11 in process element 36 may determine whether IRcur>IRMax2 (e.g., meaning that there are no more code rates to try), whether (IRcur=IRMax2) AND (IRcur!=IRorg), whether (IRcur>IRMax 1) AND the number of Tier 2 code rate blocks is greater than a predefined percentage of a total number of blocks, in the process element 36. It should be noted, however, that this list of threshold tests is not all inclusive. Rather, those skilled in the art may recognize that other forms of threshold testing which fall within the scope of the embodiments may be employed.

Now, if any of these situations in the process element 36 occur, the controller 11 then determines whether the IRcur has breached another threshold, in the process element 37. In doing so, the controller 11 may determine whether (IRcur>IRMax1) AND the number of Tier 2 code rate blocks is greater than a predefined percentage of a total number of blocks. If so, then the controller 11 retires the current R-block of the storage element 14 and exits the RCFR test, in the process element 35. Otherwise, the controller 11 enters a page retirement policy illustrated in FIG. 4 to determine whether certain pages of the R-block of the storage element 14 should be retired, in the process element 39.

If the controller 11 determines that the IRcur threshold has not been breached, in the process element 36, then the controller 11 writes to the current R-block, in the process element 38 (e.g., using test data, random data, etc.). The controller 11 then determines whether programming the R-block failed, in the process element 40. If so, then the controller 11 enters the page retirement policy, in the process element 39. Otherwise, the controller 11 reads the R-block, in the process element 41, and then determines whether the pages of the R-block experienced a successful data recovery, in the process element 42. For example, the controller 11 may read the R-block and perform a soft decision LDPC (SLDPC).

If the data recovery was unsuccessful, the controller 11 increments the IRcur to the next level of code rate, in the process element 43, and then erases the R-block, in the process element 33, in an attempt to retest the R-block and keep the R-block operational. If, however, the data was successfully read, the controller 11 then obtains block level statistics of the R-block, in the process element 44. This generally includes the controller 11 determining the number of pages in the block that failed an HLDPC check, determining the number of retries for a total number of clock cycles for the HLDPC check, and determining the total number of clock cycles it takes for an LDPC decoder to decode block. Alternatively or additionally, the controller 11 may determine a number of iterations it took for the LDPC decoder to decode the block.

With the block level statistics, the controller 11 determines whether the number of retries for the HLDPC check for a threshold number of pages of the R-block has exceeded a threshold level, in the process element 45. If the threshold is exceeded, then the controller 11 increments the IRcur, in the process element 43, and restarts the RFCR test as discussed above (e.g., albeit without the data recycling of the process element 32 as the data currently therein is used for testing purposes). If the number of retries has not exceeded the threshold, then the controller 11 determines whether the IRcur has breached a threshold, in the process element 46. In doing so, the controller 11 may determine whether IRcur<=IRMax1. If so, the controller 11 determines whether a total number of clock cycles is greater than a threshold number of clock cycles used for the LDPC decoder to decode current R-block, in the process element 47. Otherwise, the controller 11 attempts to erase the R-block, in the process element 48.

If the controller 11 determines that the total number of clock cycles is greater than the threshold number of clock cycles, then the controller increments the IRcur to the next code rate, in the process element 43, and restarts the RCFR test. If the total number of clock cycles is less than the threshold number of clock cycles, the controller 11 attempts to erase the R-block, in the process element 48. Again, the total number of clock cycles test could be implemented by a comparison of a number of LDPC decode iterations to a threshold number of LDPC decode iterations. These thresholds can be configured in hardware, firmware, software, or any combination thereof.

If the erasure failed (process element 49), the controller 11 then retires the R-block and exits the RFCR test, in the process element 35. At this point, the current R-block is removed from the pool of storage and I/O operations to the R-block cease. Otherwise, the controller 11 updates the code rate test to the IRcur, in the process element 50, and exits the RFCR test. At this point, the current R-block is deemed operational and the suspension is removed such that I/O operations to the R-block can resume. In another embodiment, the controller 11 may retire only the block on which the erase failure occurred.

Although the process has been shown and described with respect to an R-block in one exemplary embodiment, the embodiment is not intended to be limiting in terms of scope. Rather, the embodiments may be operable with any type of storage area, e.g., a page, an R-page (where data is striped across a plurality of pages), a block, an R-block, etc.

Figure 4:
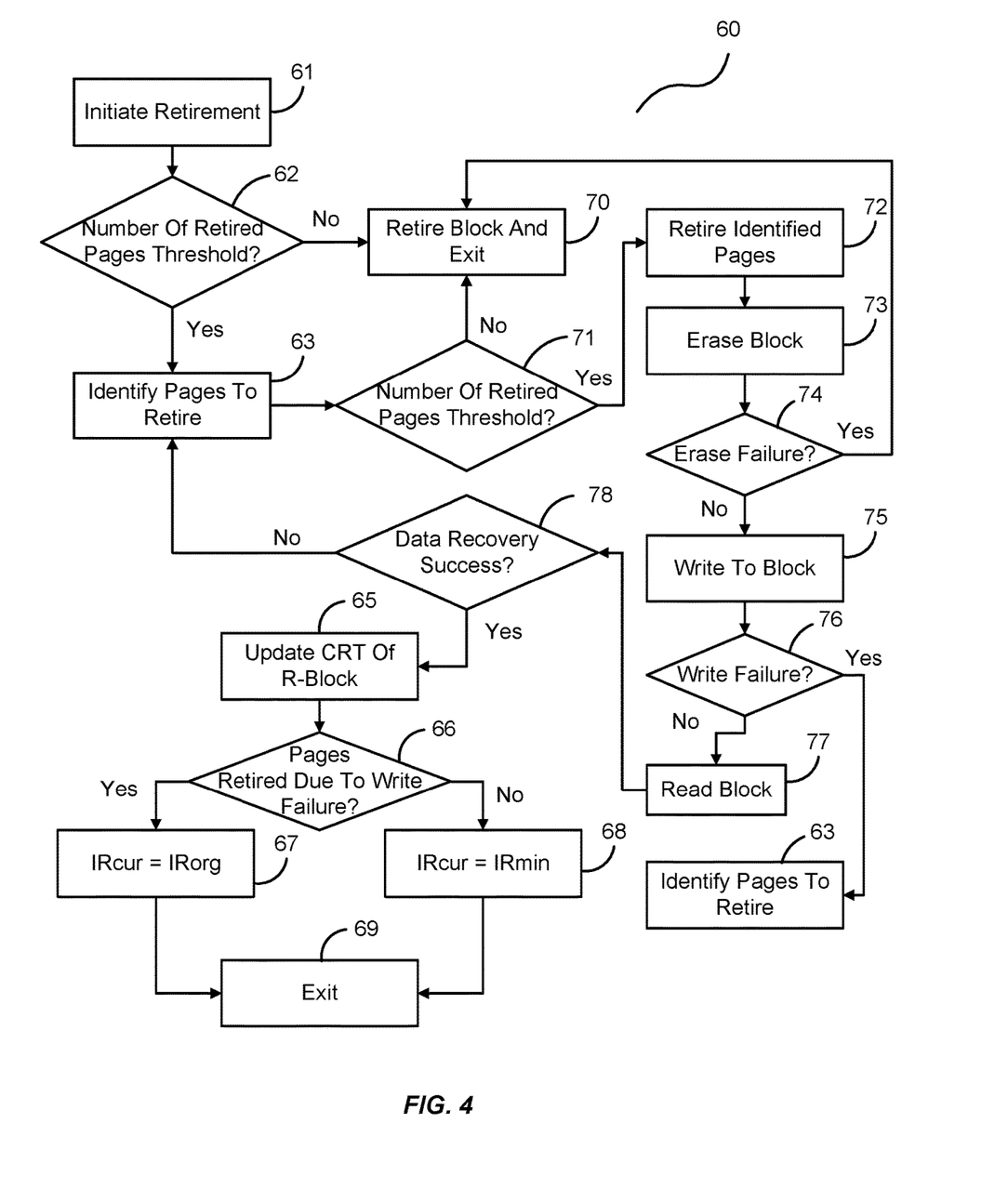

FIG. 4 is another exemplary process of the storage system 10 of FIG. 1 in which the controller 11 initiates a page retirement of a tested R-block (process element 61). Once initiated, the controller 11 determines whether a number of retired pages in the R-block have breached a threshold, in the process element 62. In doing so, the controller 11 determines whether a number of currently retired pages in the R-block is less than a threshold number of retired pages. The threshold number of retired pages is generally a firmware parameter that is established based on a number of outlier pages in an R-block that generally fail first. This number may be configured to be relatively small such that the overall performance of the R-block remains relatively high or, depending on the implementation, to minimize the storage needed to record the retired paged locations.

If the number of retired pages is greater than the threshold, then the controller 11 retires the R-block and exits the page retirement policy, in the process element 70. Otherwise, the controller 11 identifies pages to retire, in the process element 63. For example, in the RCFR test of FIG. 3, the controller 11 may have identified individual pages that failed the data recovery success check 42 or some other performance metric. The controller 11 in such an embodiment would have flagged those pages for potential retirement before entering the page retirement policy.

Alternatively or additionally, when the controller 11 initiated the page retirement policy, the controller 11 may program individual pages of the R-block with test data. The controller 11 may then read those pages to determine a level of degradation of the pages from data errors (e.g., via ECC decoding, SLDPC decoding, etc.). In some embodiments, the controller 11 identifies a page for retirement by determining whether the page failed with a code rate index of IRMax2, whether the page experienced a program failure, whether the page failed a performance metric in the RFCR test with a code rate index of IRMax2, or any combination thereof.

With the pages identified for retirement, the controller 11 employs another retired page threshold, in the process element 71, to determine whether the current number of retired pages plus the number of pages to retire is still less than the threshold number of retired pages. If this number is greater than the threshold, then the controller II retires the R-block and exits the page retirement policy, in the process element 70.

If the number of retired pages plus the number of pages to retire is still less than the threshold number of retired pages, then the controller 11 retires the identified pages, in the process element 72, and erases the R-block, in the process element 73. Once the current R-block is erased, the controller 11 determines whether the R-block experienced in an erase failure, in the process element 74. If so, then the controller 11 retires the R-block and exits the page retirement policy, in the process element 70.

If the block did not experience an erase failure, then the controller 11 writes to the page of the R-block (e.g., using test data), in the process element 75, and determines whether a write failure occurred, in the process element 76. If the page did experience a write failure, then the controller 11 continues testing on the page by returning to the process element 64 to identify pages for retirement so as to ensure the page is truly failing.

If the page did not experience a write failure, then the controller 11 reads the entire R-block, in the process element 77, and determines whether the data recovery was successful using some predetermined recovery steps, in the process element 78. For example, the controller may perform SLDPC decoding of the data in an attempt to recover the data.

If the data recovery was successful, then the controller 11 updates the code rate table of the R-block (e.g., the table shown above) with its code rate index, in the process element 65. By now, the controller 11 has determined that the R-block may be salvageable. So, the controller 11 determines whether the pages that are been retired were due to a write failure, in the process element 66. If so, the controller 11 establishes the IRcur to the original code rate index IRorg, in the process element 67, and then exits the page retirement policy, in the process element 69. If the pages were not retired due to a write failure, the controller 11 establishes the IRcur to the minimum code rate index IRmin, in the process element 68, and then exits the page retirement policy, in the process element 69. In another embodiment, upon exiting the page retirement process 60, block level statistics can be collected as in the process element 44 in order to confirm that the performance metrics of the process elements 45 and 47 are still met.

One reason for updating the code rate table of the R-block regards the ability of the R-block to support higher code rates. For example, the code rate of the block is generally lowered when pages are failing. But, once failing pages are retired, the block may be able to use higher code rates as the retired pages will not be tested or used again. So, the controller 11 updates the code rate table of the R-block to a higher code rate for the block.

Additionally, during the manufacture of the storage device 15 (or at any point in the life time of the storage device 15), if a test is run to set the code rate index of each block, the same failing page detection can be applied. This would tend to maximize the over provisioning at the beginning of life of the storage device 14 should a page or word line be defective. And, if an outer code is used, then the page retirement policy can be applied to all the pages in a stripe.

While the embodiments have been shown and described with respect to writing to a single page during testing, the embodiments are not intended to be limited to such. For example, when writing to an SSD, write algorithms generally direct the controller 11 to write a plurality of pages at one time so as to reduce I/O congestion. Additionally, writing may occur to portions of other types of storage devices.

In some embodiments, the retired portions of the storage device may be flagged to indicate that the I/O operations to those portions are terminated. For example, retired pages of the storage area may be kept in a list stored in RAM with their locations for access by the controller 11 to ensure that the controller 11 does not write live data to it. Any type of flagging may be used though (e.g., indicator bits).

Figure 5:
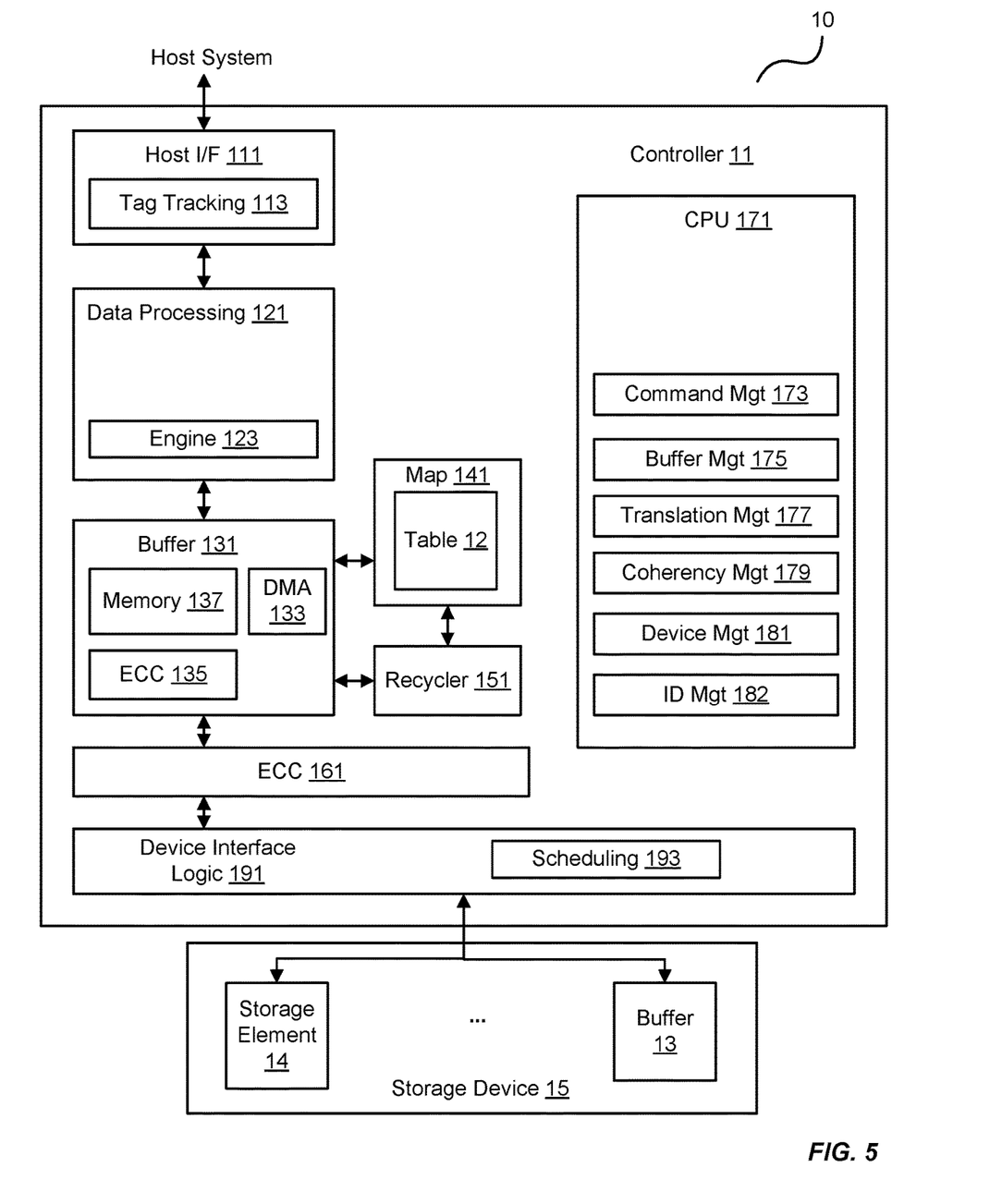
FIG. 5 is a block diagram of an exemplary storage controller and its associated storage device.
Figure 6:
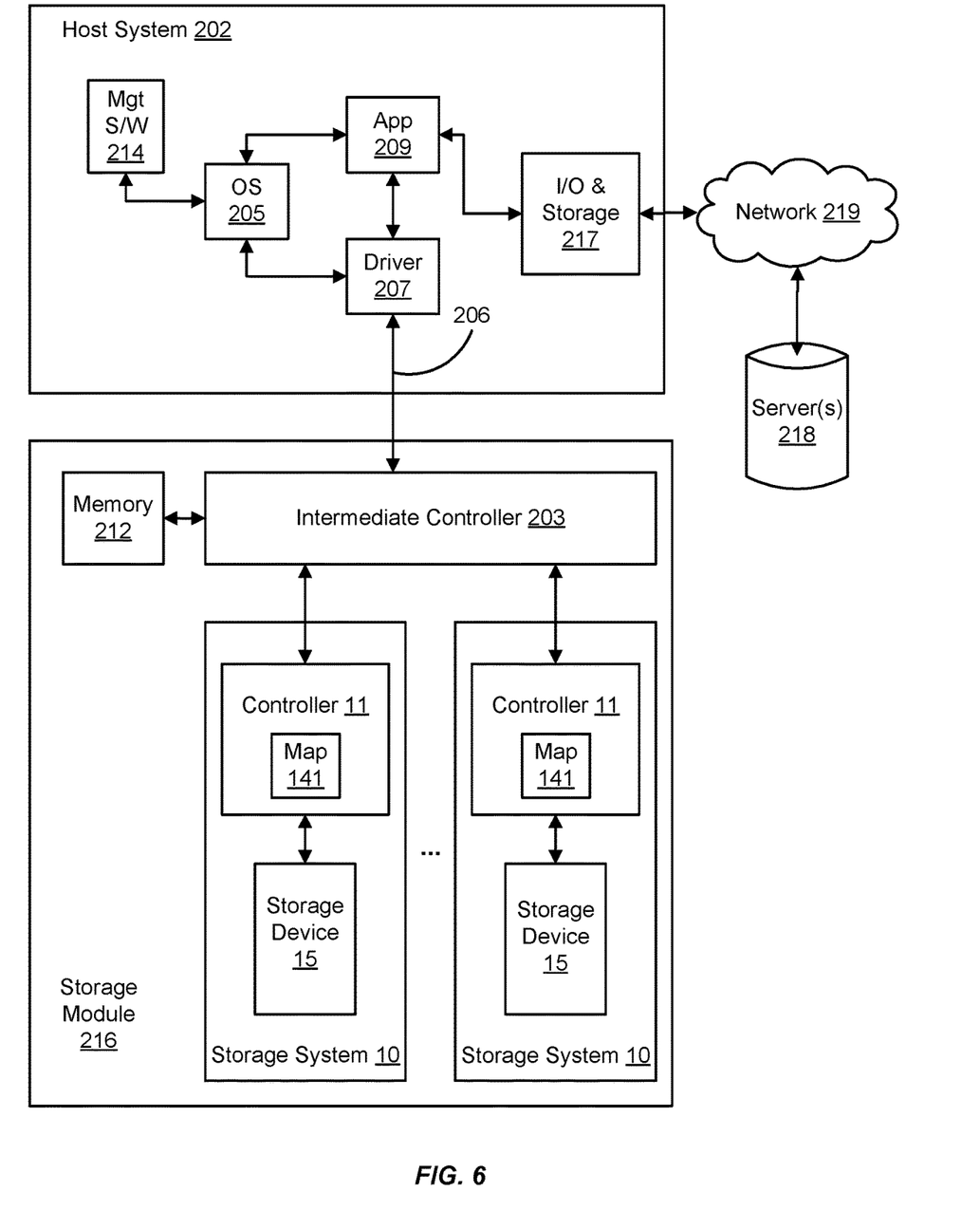
FIG. 6 is a block diagram of an 1/0 module comprising storage devices and their associated controllers interfacing with a host system.

The embodiments herein can take the form of hardware, firmware, software, or a combination thereof. FIGS. 5 and 6 illustrate such a combination that may be operable to employ the systems and methods described herein. More specifically, FIG. 5 is a block diagram of an exemplary storage system 10 and its associated device controller (e.g., the controller 11) and storage device 15 (e.g., the storage element 14 and the buffer 13 of FIG. 1). FIG. 6 is a block diagram of a storage module 216 comprising storage systems 10 and their associated controllers 11/storage devices 15 interfacing with a host system 502.

In FIG. 5, the controller 11 includes a host interface 111 that is operable to interface with a host system to communicate I/O operations of the host system. The host interface 111 may be configured with a tag tracking module 113 that is operable to track progress of individual I/O commands (e.g., read and write commands to certain addresses in the storage device 15). The tag tracking module 113 may associate an external flag of a command received from the host system with an internal flag that the controller 11 can access during processing of the command to identify the status of the processing.

The controller 11 also includes a data processing module 121 that comprises a processing engine 123 generally operable to perform certain tasks on data that is received from the host interface 111 or residing within a buffer 131, such as one or more of formatting the data, transcoding the data, compressing the data, decompressing the data, encrypting the data, decrypting the data, data encoding/formatting, or any combination thereof. For example, a processing engine 123 of the data processing module 121 may be operable to process the I/O operation from an I/O module of the host system generating the operation, such that the data of the I/O operation may be written to the logical address of the storage device 15. The processing engine 123 may extract the data of the write I/O command and prepare it for storage in the storage device 15. In doing so, the processing engine 123 may compress the data using any of a variety of data compression algorithms. When retrieving the data from the storage device 15, the processing engine 123 may decompress the data according to the algorithm used to compress the data for storage.

The buffer 131 is operable to store data transferred to and from the host system. The buffer 131 may also store system data, such as memory tables used by the controller 11 to manage the storage element 14, the buffer 13, and any possible higher-level RAID functionality in the memory 137. Other modules may include an ECC module 135 to provide higher-level error correction and redundancy functionality, and a Direct Memory Access (DMA) module 133 to control movement of data to and from the buffer 131.

The controller 11 also includes an error correction code module 161 operable to provide lower level error correction and redundancy processing of the data in the buffer 131 using any of a variety of error correction codes techniques (e.g., cyclic redundancy checks, Hamming codes, BCH codes, LDPC codes, etc.).

A device interface logic module 191 is operable to transfer data to and from the storage device 15 according to the protocol of the devices therein. The device interface logic module 191 includes a scheduling module 193 that is operable to queue I/O operations to the storage device 15.

The controller 11 herein also includes a map module 141 that is operable to perform data addressing to locations in the storage device 15 according to the lookup table 12. For example, the map module 141 may use the lookup table 12 to convert logical block addresses (LBAs) from the host system to block/page addresses directed to the buffer 13, the storage element 14, or both. The lookup table 12 may be stored in whole or in part in controller 11 and/or in storage device 15. For example, in some embodiments a portion of the lookup table 12 may be cached in the controller 11 with generally all of lookup table 12 being stored non-volatilely in the storage device 15.

A recycler 151 performs garbage collection on behalf of the controller 11. For example, the recycler 151 may determine portions of the storage device 15 that are actively in use by scanning the lookup table 12 of the map module 141. In this regard, the recycler 151 may make unused, or "deallocated", portions of the storage device 15 available for writing by erasing the unused portions. The recycler 151 may also move data within the storage device 15 to make larger contiguous portions of the storage device 15 available for writing.

The controller 11 also includes one or more central processing units (CPUs) 171 that controls various aspects of the controller 11. For example, the CPU 171 may process instructions or firmware to implement command management 173 that tracks and controls commands received from the host system. This firmware may also implement buffer management 175 that controls allocation and use of the buffer 131 and translation management 177 or to control the map module 141. The firmware may also employ coherency management 179 to control consistency of data addressing to avoid conflicts such as those that may occur between external data accesses and recycled data accesses. The firmware may also provide device management 181 to control the device interface logic module 191 and identity management 182 to control modification and communication of identity information of components within the controller 11.

In FIG. 6, the host system 202 is operable to process software instructions and perform I/O operations with the storage module 216 to read from and write to one or more storage systems 10. In this regard, the host system 202 may include an operating system 205 that provides the computing environment for the host system 202. A driver 207 is operable to communicate through the link 206 to the storage module 216 to perform the I/O operations with the various storage systems 10 configured therewith.

Like other computing systems, the operating system 205 may be initiated via management software 214 (e.g., Bios software). The host system 202 may also include application software 209 to perform various computing processes on behalf of the host system 202 (e.g., word processing applications, image processing applications, etc.). The host system 202 may also include I/O and storage functionality 217 operable to conduct I/O operations with one or more servers 218 through a communication network 219 (e.g., the Internet, local area networks, wide-area networks, etc.). In this regard, the storage module 216 may act as a cache memory of I/O operations for the host system 202.

The storage module 216 may be configured with an intermediate controller 203 that is operable to switch various I/O operations of the host system 202 to LBAs of the storage systems 10. In this regard, the storage module 216 may include a memory 212 that stores mapping information for the intermediate controller 203 to conduct the I/O operations to the LBAs. The map module 141 of the controller 11 may also be operable to perform data addressing with variable-sized mapping units to locations in the storage device 15 according to the lookup table 12, and to convert LBAs from the host system 202 to block/page addresses directed to the storage device 15.

It should be noted that the embodiments disclosed herein are not limited to any type of storage device 15 as such may be implemented in other persistent storage devices, including HDDs, SSDs, magnetoresistive storage devices, or the like.

What is claimed is:

1. A method operable with a storage device comprising a plurality of storage areas operable to store data, the method comprising steps of:
   identifying a number of individual portions of a first storage area of the plurality of storage areas of the storage device to retire;
   determining whether a total of the number of identified individual portions of the first storage area to retire and a number of individual portions of the first storage area already retired is less than a threshold total;
   upon determining that the total of the number of identified individual portions to retire and the number of individual portions already retired is not less than the threshold total, retiring the entire first storage area;
   upon determining that the total of the number of identified individual portions to retire and the number of individual portions already retired is less than the threshold total, retiring the identified individual portions of the first storage area;
   testing the remaining individual portions of the first storage area;
   determining whether individual portions of the first storage area were retired due to write failures during the testing;
   upon determining that individual portions of the first storage area were retired due to write failure, setting a current code rate index associated with the first storage area to an original code rate index for the first storage area; and
   upon determining that no individual portions of the first storage area were retired due to write failure, setting the current code rate index associated with the first storage area to a minimum code rate index.

2. The method of claim 1, wherein:
   the storage device is a Solid State Drive (SSD), the plurality of storage areas of the SSD are R-blocks of a NAND flash device, and the individual portions of the storage areas of the NAND flash device are pages.

3. The method of claim 1, wherein testing the remaining individual portions of the first storage area comprises steps of:
   writing test data to the remaining individual portions of the first storage area;
   determining whether at least one write failure occurred in writing the test data;
   upon determining that at least one write failure occurred, returning to the identifying step to identify whether any remaining individual portions of the first storage should be retired;
   upon determining that no write failures occurred, reading the first storage area;
   determining whether the test data was successfully recovered from the first storage area; and
   upon determining that the test data was not successfully recovered from the first storage area, returning to the identifying step to identify whether any remaining individual portions of the first storage should be retired.

4. The method of claim 1, further comprising, before testing the remaining individual portions of the first storage area:
   erasing the first storage area;
   determining whether an erase failure occurred to the first storage area; and retiring the first storage area upon detection of the erase failure to the first storage area.

5. The method of claim 1, wherein:
the current code rate index associated with the first storage area is one of a plurality of tiered code rate indices, and
the minimum code rate index is associated with the highest code rate in the tiered code rates.

6. The method of claim 1, wherein identifying individual portions of the storage area to retire comprises steps of:
writing test data to a first individual portion of the first storage area using a code rate associated with a first code rate index;
reading the test data from the first individual portion;
determining whether the test data was successfully recovered from the first individual portion;
upon determining that the test data was not successfully recovered from the first individual portion, incrementing the code rate index;
determining whether the incremented code rate index exceeds a maximum code rate index;
upon determining that the incremented code rate index exceeds the maximum code rate index, identify the first individual portion for retirement; and
upon determining that the incremented code rate index does not exceed the maximum code rate index, repeating the writing, reading, and determining steps using a code rate associated with the incremented code rate index.

7. The method of claim 6, wherein:
the code rate associated with the maximum code rate index is based on a threshold number of clock cycles used for low density parity check (LDPC) decoding.

8. A storage system, comprising:
a storage device comprising a plurality of storage areas operable to store data; and
a controller operable to manage the plurality of storage areas of the storage device and configured to:
identify a number of individual portions of a first storage area of the plurality of storage areas of the storage device to retire,
determine whether a total of the number of identified individual portions of the first storage area to retire and a number of individual portions of the first storage area already retired is less than a threshold total,
upon determining that the total of the number of identified individual portions to retire and the number of individual portions already retired is not less than the threshold total, retire the entire first storage area,
upon determining that the total of the number of identified individual portions to retire and the number of individual portions already retired is less than the threshold total, retire the identified individual portions of the first storage area,
test the remaining individual portions of the first storage area,
determine whether individual portions of the first storage area were retired due to write failures during the testing,
upon determining that individual portions of the first storage area were retired due to write failure, setting a current code rate index associated with the first storage area to an original code rate index for the first storage area, and
upon determining that no individual portions of the first storage area were retired due to write failure, setting the current code rate index associated with the first storage area to a minimum code rate index.

9. The storage system of claim 8, wherein:
the storage device is a Solid State Drive (SSD), the plurality of storage areas of the SSD are R-blocks of a NAND flash device, and the individual portions of the storage areas of the NAND flash device are pages.

10. The storage system of claim 8, wherein testing the remaining individual portions of the first storage area comprises steps of:
writing test data to the remaining individual portions of the first storage area;
determining whether at least one write failure occurred in writing the test data;
upon determining that at least one write failure occurred, returning to the identifying step to identify whether any remaining individual portions of the first storage should be retired;
upon determining that no write failures occurred, reading the first storage area;
determining whether the test data was successfully recovered from the first storage area; and
upon determining that the test data was not successfully recovered from the first storage area, returning to the identifying step to identify whether any remaining individual portions of the first storage should be retired.

11. The storage system of claim 8, wherein the controller is further configured to, before testing the remaining individual portions of the first storage area:
erase the first storage area;
determine whether an erase failure occurred to the first storage area; and
retire the first storage area upon detection of the erase failure to the first storage area.

12. The storage system of claim 8, wherein:
the current code rate index associated with the first storage area is one of a plurality of tiered code rate indices, and
the minimum code rate index is associated with the highest code rate in the tiered code rates.

13. The storage system of claim 8, wherein identifying individual portions of the storage area to retire comprises steps of:
writing test data to a first individual portion of the first storage area using a code rate associated with a first code rate index;
reading the test data from the first individual portion;
determining whether the test data was successfully recovered from the first individual portion;
upon determining that the test data was not successfully recovered from the first individual portion, incrementing the code rate index;
determining whether the incremented code rate index exceeds a maximum code rate index;
upon determining that the incremented code rate index exceeds the maximum code rate index, identify the first individual portion for retirement; and
upon determining that the incremented code rate index does not exceed the maximum code rate index, repeating the writing, reading, and determining steps using a code rate associated with the incremented code rate index.

14. The storage system of claim 13, wherein:
the code rate associated with the maximum code rate index is based on a threshold number of clock cycles used for low density parity check (LDPC) decoding.

15. A non-transitory computer readable medium comprising instructions that, when executed by a controller of a storage device, direct the controller to:
identify a number of individual portions of a first storage area of the storage device to retire;
determine whether a total of the number of identified individual portions of the first storage area to retire and a number of individual portions of the first storage area already retired is less than a threshold total;
upon determining that the total of the number of identified individual portions to retire and the number of individual portions already retired is not less than the threshold total, retire the entire first storage area;
upon determining that the total of the number of identified individual portions to retire and the number of individual portions already retired is less than the threshold total, retire the identified individual portions of the first storage area;
test the remaining individual portions of the first storage area;
determine whether individual portions of the first storage area were retired due to write failures during the testing;
upon determining that individual portions of the first storage area were retired due to write failure, setting a current code rate index associated with the first storage area to an original code rate index for the first storage area; and
upon determining that no individual portions of the first storage area were retired due to write failure, setting the current code rate index associated with the first storage area to a minimum code rate index.

16. The non-transitory computer readable medium of claim 15, wherein:
the storage device is a Solid State Drive (SSD), the first storage area of the SSD comprises an R-block of a NAND flash device, and the individual portions of the first storage area of the NAND flash device are pages.

17. The non-transitory computer readable medium of claim 16, wherein the threshold total comprises a firmware parameter representing a number of outlier pages in an R-block that generally fail first.

18. The non-transitory computer readable medium of claim 15, wherein setting a current code rate index associated with the first storage area results in a higher code rate being used for writing and reading data to and from the first storage area subsequent to retirement of the identified individual portions.

19. The non-transitory computer readable medium of claim 15, wherein:
the current code rate index associated with the first storage area is one of a plurality of tiered code rate indices, and
the minimum code rate index is associated with the highest code rate in the tiered code rates.

20. The non-transitory computer readable medium of claim 15, wherein testing the remaining individual portions of the first storage area comprises steps of:
writing test data to the remaining individual portions of the first storage area;
determining whether at least one write failure occurred in writing the test data;
upon determining that at least one write failure occurred, returning to the identifying step to identify whether any remaining individual portions of the first storage should be retired;
upon determining that no write failures occurred, reading the first storage area;
determining whether the test data was successfully recovered from the first storage area; and
upon determining that the test data was not successfully recovered from the first storage area, returning to the identifying step to identify whether any remaining individual portions of the first storage should be retired.

* * * * *